(12) United States Patent
Ezoe

(10) Patent No.: US 7,372,287 B2
(45) Date of Patent: May 13, 2008

(54) SEMICONDUCTOR DEVICE TESTING APPARATUS AND DEVICE INTERFACE BOARD

(75) Inventor: Hiroshi Ezoe, Tokyo (JP)

(73) Assignee: Advantest Corporation, Tokyo (JP)

( * ) Notice: Subject to any disclaimer, the term of this patent is extended or adjusted under 35 U.S.C. 154(b) by 143 days.

(21) Appl. No.: 10/569,902

(22) PCT Filed: Dec. 28, 2004

(86) PCT No.: PCT/JP2004/019639

§ 371 (c)(1),
(2), (4) Date: Feb. 27, 2006

(87) PCT Pub. No.: WO2005/088324

PCT Pub. Date: Sep. 22, 2005

(65) Prior Publication Data

US 2007/0205790 A1    Sep. 6, 2007

(30) Foreign Application Priority Data

Mar. 12, 2004  (JP)  ............................. 2004-071814

(51) Int. Cl.
  *G01R 31/28* (2006.01)
  *G01R 31/02* (2006.01)
(52) U.S. Cl. .................................. 324/765; 324/158.1
(58) Field of Classification Search ...................... None
See application file for complete search history.

(56) References Cited

U.S. PATENT DOCUMENTS

| | | | | |
|---|---|---|---|---|
| 6,459,285 B1 * | 10/2002 | Okabe | ......................... | 324/754 |
| 6,759,854 B2 * | 7/2004 | Logisch | ...................... | 324/629 |
| 6,784,674 B2 * | 8/2004 | Miller | ........................ | 324/754 |

FOREIGN PATENT DOCUMENTS

| JP | 2000-292491 | 10/2000 |
|---|---|---|
| JP | 2001-296335 | 10/2001 |

\* cited by examiner

*Primary Examiner*—Ernest Karlsen
(74) *Attorney, Agent, or Firm*—David N. Lathrop, Esq.; Gallagher & Lathrop

(57) ABSTRACT

A interface board is provided with a first and second contact instruments each comprising a first and second contact terminal groups to which a first to third type semiconductor devices having different numbers of external terminals used can be connected. The first contact terminal group of the first contact instrument is connected to the corresponding terminals of the second contact terminal group of the second contact instrument using bridging lines. One end of each bridging wire is connected to a driver output pin of an IO channel provided in pin electronics. The other end of the bridging wire is connected to a comparator input pin of the IO channel provided in the pin electronics. The first contact terminal group of the second contact instrument is connected, using different connection lines, to a driver output pin and a comparator input pin of an IO channel provided in the pin electronics.

5 Claims, 14 Drawing Sheets

SEMICONDUCTOR DEVICE TESTING APPARATUS AND DEVICE INTERFACE BOARD

CONTINUING DATA

This application is a 371 of PCT/JP04/19639, filed Dec. 28, 2004.

TECHNICAL FIELD

The present invention relates to a semiconductor device testing apparatus and a device interface board that electrically connects a semiconductor device under test to the semiconductor device testing apparatus, and more specifically, to a semiconductor device testing apparatus that can effectively utilize IO channels to increase the number of semiconductor devices under test (hereinafter simply referred to as DUTs) or the number of DUT types, as well as a device interface board therefor.

BACKGROUND ART

Patent literature 1 discloses a configuration in which a drive signal is applied to one end of a transmission line, which breaks up into two transmission lines connected respectively to two DUTs. This configuration enables one IO channel to drive two DUTs, thus making it possible to effectively utilize the IO channel. Patent literature 1 also discloses a semiconductor device testing apparatus that uses a two-branched transmission line enabling a reduction in unwanted oscillating waveform in a received waveform signal at a reception end.

FIG. 11 is a conceptual diagram showing a configuration in which a common semiconductor device testing apparatus is combined with an IC handler apparatus 300 to test multiple DUTs.

The semiconductor device testing apparatus 100 includes an apparatus main body 101 and a test head 200 separated from the apparatus main body 101 and connected to the IC handler apparatus 300 via a coupling line. The test head 200 has pin electronics PE comprising a plurality of IO channel groups each including N (an integer equal to or larger than 2) IO channels, a normal channel (not shown in the drawings), and others (not shown).

The IO channels are connected to IO pins (input/output terminals) of a corresponding DUT and provide functions of applying signals to the DUT and receiving response signals output by the DUT. The number of IO channels provided normally corresponds to the number of IO pins (that is, the number of input/output terminals). The normal channel is connected to an input pin of a DUT and composed only of a driver that applies signals to the DUT.

The DUTs and the semiconductor device testing apparatus are connected together via a performance board PB connected to the pin electronics PE in the test head section 200, a coaxial cable 120, socket boards 160, and contact sockets 180. A spacing frame 140 mounts the socket boards 160 on the performance board PB. A combination of the spacing frame 140 and the performance board PB is called a high fix 102.

Patent literature 1: Japanese Patent Application Laid-Open No. 2000-292491

DISCLOSURE OF THE INVENTION

Problems to be Solved by the Invention

In the connection structure disclosed in Patent literature 1, an output from the driver in one IO channel is transmitted through one transmission line, which breaks up into two at a junction point. The resulting two lines are connected respectively to two DUTs, which are thus driven simultaneously.

Two DUTs can thus be simultaneously tested using one IO channel group, thus enabling the effective use of a finite number of IO channels. However, the structure disclosed in Patent literature 1 cannot achieve a sufficient waveform quality.

When this technique is applied to a special form in which one DUT has plural pairs of an input/output terminals operating during different periods in accordance with switching control signals as shown in FIG. 12B, one IO channel can be associated with two terminals, thus enabling the number of IO channels to be reduced to half. However, this structure can neither achieve a sufficient waveform quality.

In a trial circuit shown in FIG. 12B, a pair of an input/output pins of a DUT operates in association with one driver output pin P. One end of a coaxial cable is connected to the driver output pin P. The other end of the coaxial cable is connected to a terminal Q on the socket board. A micro strip line of characteristic impedance 50Ω connects the terminal Q to a junction point R. Two branched lines extended from the junction point R are connected to a pair of input/output terminals.

FIG. 12C shows an example in which, in the above trial circuit, a driver IODR applies a fast rectangular wave, with the resulting waveform observed at an observation point (View) corresponding to one of the input/output terminals of the DUT. In the waveform shown in this figure, b denotes a waveform obtained when the branching line from the junction point R to each input/output terminal has a characteristic impedance of 100Ω, and b' denotes a waveform obtained when the characteristic impedance is 50Ω.

For comparison, FIG. 12C shows an ideal waveform a which was obtained at an input/output terminal (View) of a DUT in a circuit configuration in accordance with the conventional art which does not have the branching lines shown in FIG. 12A.

A comparison of these waveforms will be described below. In FIG. 12B, if the impedance of each branching line from the junction point to the respective terminal of the DUT is: 50Ω(case (b')), the impedance seen from the junction point R toward the DUT becomes 50Ω/2=25Ω, which does not match the characteristic impedance (50Ω) looking toward the junction point R. This leads to a degraded waveform. If the impedance of each branching line is: 100Ω(case (b)), the impedance seen from the junction point R toward the DUT is 100Ω/2=50Ω, which indicates an impedance matching. However, when the impedance is seen from one of the input/output terminals toward the junction point with respect to from a signal which is totally reflected by the one input/output terminal, the impedance of the one branching line toward the junction point is 100Ω, followed by a parallel impedance of @33Ω consisting of a parallel circuit of the input impedance of 50Ω and the impedance of the other branching line of 100Ω. This causes impedance mismatching to degrade the waveform. In either case, in this testing apparatus, the terminal resistance of 50Ω cannot be connected to the DUT side. Consequently, the waveform is unavoidably degraded as a result of the total reflection. This is a major problem with the two-branch system.

An improved semiconductor device testing apparatus is therefore required which overcomes the disadvantage of a trial example such as the one shown in FIG. 12B, that is, the degradation of quality of the waveform, and which enables the effective use of a finite number of IO channels.

Another improved semiconductor device testing apparatus is also required that enables the effective use of a finite number of IO channels, it is necessary to provide such a semiconductor device testing apparatus as and that can test three types of semiconductor devices each having the same number of terminals and the same terminal array within the same package but having different data widths for write/read IO pins, ×4, ×8, and ×16 bits, as shown in FIG. 13.

In FIG. 13A, only 4-bit IO pins DQ0 to DQ4 are used to input and output data, whereas pins NC4 to NC15 are not used for this purpose. In FIG. 13B, only 8-bit IO pins DQ0 to DQ7 are used to input and output data, whereas pins NC8 to NC15 are not used for this purpose. In FIG. 13C, 16-bit IO pins DQ0 to DQ15 are all used to input and output data. In the description below, the semiconductor device having a data width of ×4 bits as shown in FIG. 13A is called a first type semiconductor device DUT-1. The semiconductor device having a data width of ×8 bits as shown in FIG. 13B is called a second type semiconductor device DUT-2. The semiconductor device having a data width of ×16 bits as shown in FIG. 13C is called a third type semiconductor device DUT-3.

To allow one semiconductor device testing apparatus to test these types of semiconductor devices, it is necessary for the testing apparatus to have, on each socket board, a sufficient number of IO channels to deal with such one type DUT among the three types of DUTs which may be installed on the socket board as which requires the maximum number of terminals to be used for its operation. In the above example, 16 IO channels are to be provided in order to test the third type DUT-3.

On the other hand, the socket boards corresponding to the three types of DUTs have dedicated connection configurations for the IO pins DQ0 to DQ4, DQ0 to DQ7, and DQ0 to DQ15 of these types of DUTs. FIG. 14 shows an example of socket boards for these types of semiconductor devices. FIG. 14A is a socket board 160-1 for the first type semiconductor device DUT-1. FIG. 14B is a socket board 160-2 for the second type semiconductor device DUT-2. FIG. 14C is a socket board 160-3 for the third type semiconductor device DUT-3.

Each contact socket 180 is provided with contacts CNT having the same number of pins and the same pin array. The IO pins of DUTs are inserted into the contacts. The respective contact sockets 180 are connected to corresponding socket boards. A socket board 160-1 is provided with an external connection terminal group consisting of four terminals T1 to T4. Pattern wiring is formed so that the terminals T1 to T4 are connected to four operation terminals DQ0 to DQ3 of the DUT-1. A socket board 160-2 is provided with an external connection terminal group consisting of eight terminals T1 to T8 pattern-connected to eight operation terminals DQ0 to DQ7 of the DUT-2. Likewise, a socket board 160-3 is provided with an external connection terminal group consisting of 16 terminals T1 to T16 pattern-connected to 16 operation terminals DQ0 to DQ15 of the DUT-3.

As is apparent from these figures, the pattern wiring on each socket board needs to be designed and manufactured for each DUT type. Further, if devices present on semiconductor wafers are to be tested, a prober must be provided for each type of semiconductor devices.

The user must thus prepare a socket board or prober for each DUT type and thus suffers a heavy economic burden.

If plural types of semiconductor devices are tested using one semiconductor device testing apparatus, it is necessary to reduce the number of IO channel groups or double the number of DUTs that can be tested per IO channel group.

An object of the present invention is to solve the problems of the conventional examples, in particular, to provide a semiconductor device testing apparatus that enables the effective use of IO channels, and more specifically, to provide a semiconductor device testing apparatus that reduces the number of IO channels required for one DUT compared to the conventional art or which enables an increase in the number of DUT types that can be tested by one IO channel group.

Another object of the present invention is to provide a device interface board used in the semiconductor device testing apparatus.

More specifically, the object of the present invention is to provide a semiconductor device testing apparatus that can test DUTs of such a type that paired IO pins are differentially switched between an operation mode and a non-operation mode at different timings by using fewer IO channels than the conventional art, or a semiconductor device testing apparatus that can test plural types of DUTs having the same number of terminals and the same terminal array but different numbers of terminals required for their operations by using a device interface board of the same structure, or a semiconductor device testing apparatus that can test plural types of DUTs having different numbers of operation IO pins by using a device interface board of the same structure.

MEANS TO SOLVE PROBLEMS

To accomplish the above object, a first invention proposes a semiconductor device testing apparatus for testing first, second, and third type semiconductor devices each having first and second external terminal groups that have the same number of terminals and the same terminal array, the first type semiconductor device operatingly using a part of the first external terminal group, the second type semiconductor device operatingly using all of the first external terminal group, and the third type semiconductor device operatingly using all of the first and second external terminal groups, wherein a device interface board is provided with a first contact instrument comprising a first contact terminal group and a second contact terminal group having the same number of terminals and the same terminal array as those of the first external terminal group and second external terminal group, and a second contact instrument having the same configuration as that of the first contact instrument so that any of the first, second, and third type semiconductor devices can be connected to the first and second contact instrument, the terminals of the first contact terminal group of the first contact instrument are connected to corresponding terminals of the second contact terminal group of the second contact instrument using bridging lines, one end of each bridging line is connected to a driver output pin of an IO channel of a first IO channel group provided in pin electronics in association with each contact terminal of the first contact terminal group of the first contact instrument, the other end is connected to a comparator input pin of the IO channel, each contact terminal of the first contact terminal group of the second contact instrument is connected, using different connection lines, to a driver output pin and a comparator input pin of an IO channel of a second IO channel group provided in the pin electronics in association with the contact terminal.

A second invention proposes a semiconductor device testing apparatus for testing first, second, and third type semiconductor devices each having first and second external terminal groups that have the same number of terminals and the same terminal array, the first type semiconductor device operatingly using a part of the first external terminal group, the second type semiconductor device operatingly using all of the first external terminal group, and the third type semiconductor device operatingly using all of the first and second external terminal groups, wherein a device interface board is provided with a first contact instrument comprising a first contact terminal group and a second contact terminal group having the same number of terminals and the same terminal array as those of the first external terminal group and second external terminal group, and a second contact instrument having the same configuration as that of the first contact instrument so that any of the first, second, and third type semiconductor devices can be connected to the first and second contact instrument, the terminals of the first contact terminal group of the first contact instrument are connected to corresponding terminals of the second contact terminal group of the second contact instrument using respective two first branching lines, each common junction point of the two first branching lines is connected to each driver output pin of an IO channel of a first IO channel group provided in pin electronics in association with each contact terminal of the first contact terminal group of the first contact instrument, the terminals of the first contact terminal group of the first contact instrument are connected to corresponding terminals of the second contact terminal group of the second contact instrument using respective two second branching lines, each common junction point of the two second branching lines is connected to a comparator input pin of an IO channel of a first IO channel group, and each contact terminal of the first contact terminal group of the second contact instrument is connected, using different connection lines, to a driver output pin and a comparator input pin of an IO channel of a second IO channel group provided in pin electronics in association with the contact terminal.

A third invention proposes a semiconductor device testing apparatus for testing a semiconductor device having at least a pair of input/output external terminals operable at different timings from each other, wherein one of the pair of the input/output external terminals is connected to the other using a bridging line, one end of the bridging line is connected to a driver output pin of an IO channel provided in pin electronics in association with the pair of the input/output external terminals, the other end is connected to a comparator input pin of the IO channel.

A fourth invention proposes any of the semiconductor device testing apparatuses according to the first or second invention, wherein the external terminals of the semiconductor device comprises pins led out of a package, the first and second contact instruments comprise a first socket and a second socket, respectively, and the device interface board comprises a socket board, and wherein, for testing, the first or the second type semiconductor device is installed in each of the first and second sockets mounted on the socket board or the third type semiconductor device is installed in the second socket.

A fifth invention proposes any of the semiconductor device testing apparatuses according to the first or second invention, wherein the external terminals of the semiconductor device comprise pads formed on a semiconductor wafer, the first and second contact instruments comprise a first probe socket and a second probe socket, respectively, and the device interface board comprises a prober, and wherein, for testing, the first or second type semiconductor device is brought into contact with each of probes installed in the first and second probe sockets mounted on the prober.

A sixth invention proposes the semiconductor device testing apparatus according to the third invention, wherein the external terminals comprise pins led out of a package, the bridging line comprises a connection line connected between socket terminals which are electrically connected to the pins, and different connection lines are used to connect the socket terminal to which one end of the bridging line is connected, to the driver output pin of the IO channel provided in the pin electronics and to connect the socket terminal to which the other end of the bridging line is connected, to the comparator input pin of the IO channel provided in the pin electronics.

A seventh invention proposes the semiconductor device testing apparatus according to the third invention, wherein the external terminals comprise pads on a semiconductor wafer, each bridging line comprises a connection line connected between contact terminals which support probes that contact to the pads, and different connection lines are used to connect a contact terminal to which one end of the bridging line is connected, to the driver output pin provided in the pin electronics and to connect a contact terminal to which the other end of the bridging line is connected, to the comparator input pin provided in the pin electronics.

An eighth invention proposes any of the device interface boards used in the semiconductor device testing apparatuses according to the fourth to seventh inventions, wherein each of the bridging line, a connection line connecting one end of the bridging line to the driver output pin of the IO channel provided in the pin electronics, and a different connection line connecting the other end of the bridging line to the comparator input pin of the IO channel provided in the pin electronics has a characteristic impedance that matches an output impedance of a driver provided in the pin electronics, and these lines are mounted on the board.

EFFECTS OF THE INVENTION

According to the first and second invention, plural types of semiconductor devices (for example, the previously defined first to third three types of semiconductor devices) having different numbers of pins, can be tested by using the same device interface board. For the first and second types of semiconductor devices, every two devices can be simultaneously tested. The third type semiconductor device can also be tested, though only one device can be tested at a time. Since these inventions allow different types of semiconductor devices to be tested by using in common the device interface board, the user is required to simply prepare the commonly usable device interface board to test plural types of devices. This eases the economic burden on the user. These inventions further eliminate the need to change the device interface board every time the device type to be tested is changed. This advantageously facilitates the easy handling of the semiconductor device testing apparatus.

In general, the number of device interface boards to be mounted in a test head is not limited to one, so that a plurality of device interface boards may be mounted in the test head. Accordingly, a large doubled number of first or second type semiconductor devices can be tested at a time. This makes it possible to improve testing efficiency.

The third invention can test a semiconductor device having pairs of an input/output pins operating during different time zones by using IO channels the number of which is half of that of the pins. The line from the driver to the comparator is continuously maintained to be a predetermined impedance value, thus suppressing the degradation of the waveform. This advantageously hinders the occurrence of a determination error in the comparator. This is very effective in a practical use.

BEST MODES FOR CARRYING OUT THE INVENTION

Figure 1:
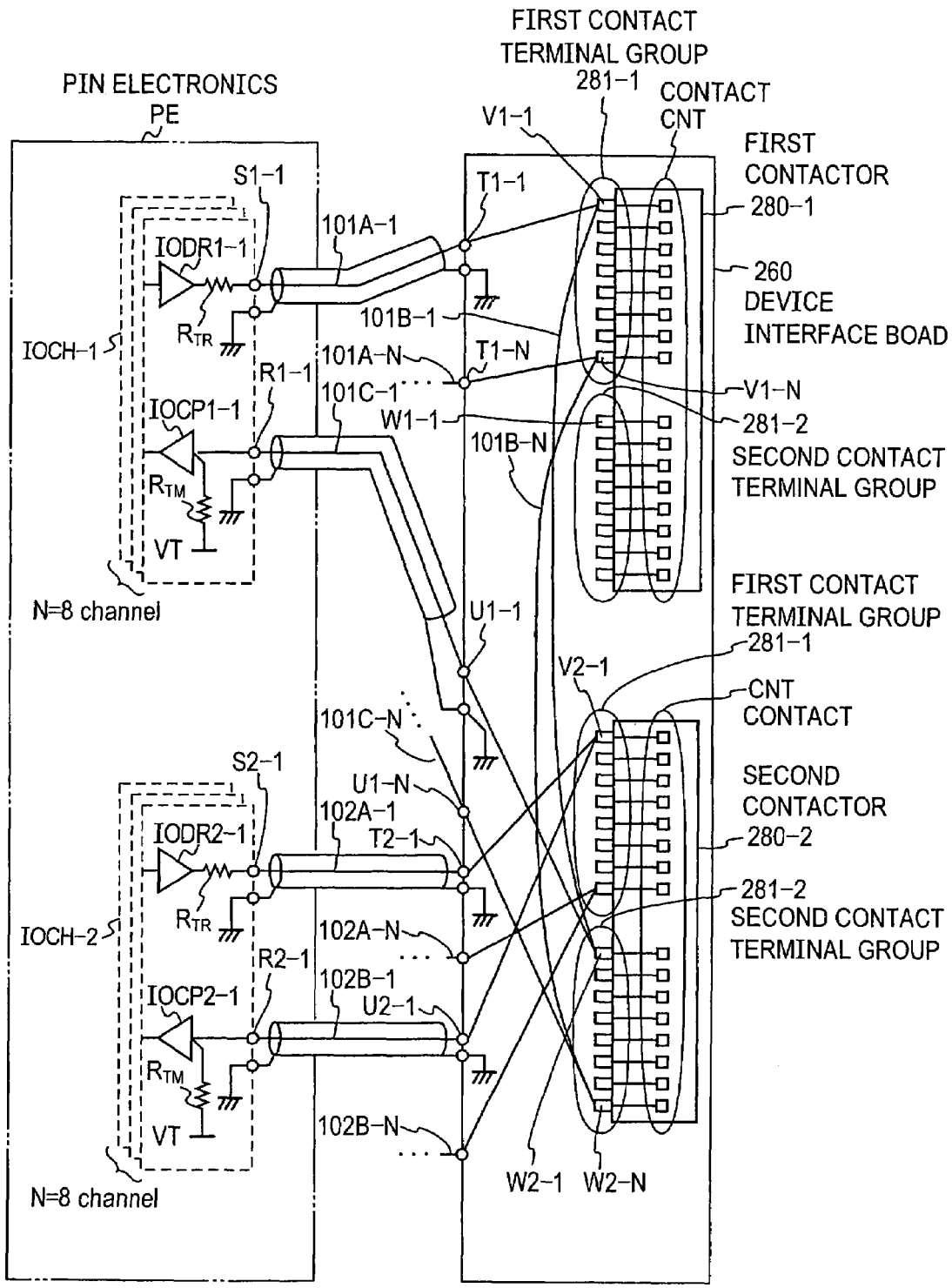
FIG. 1 is a block diagram illustrating an embodiment corresponding to Claim 1 of the present invention.

With reference to FIG. 1, description will be given of the best mode for carrying out the present invention. Reference character PE shown in FIG. 1 denotes pin electronics. In this case, the pin electronics PE comprise a first IO channel group IOCH-1 and a second IO channel IOCH-2 to each of which N (=8) channels are assigned. Reference numeral 260 denotes a device interface board. The device interface board 260 is a socket board if external terminals of a DUT are of a pin type or a prober if the external terminals of the DUT are of a pad type on a wafer. The device interface board 260 will be described below in the embodiments.

In the present invention, a first contact instrument 280-1 and a second contact instrument 280-2 are mounted on the device interface board 260. The first contact instrument 280-1 and the second contact instrument 280-2 are sockets if the external terminals of the DUT are of the pin type or probe cards if the external terminals of the DUT are of the pad type on a wafer.

The first contact instrument 280-1 comprises a first contact terminal group 281-1 consisting of contact terminals V1-1 to V1-N (N=8) and a second contact terminal group 281-2 consisting of contact terminals W1-1 to W1-N. The second contact instrument 280-2 similarly comprises a first contact terminal group 281-1' consisting of contact terminals V2-1 to V2-N (N=8) and a second contact terminal group 281-2' consisting of contact terminals W2-1 to W2-N. Each contact instrument comprises contacts CNT connected to the first contact terminal group 281-1 and second contact terminal group 281-2 on a one-to-one correspondence. The pins of the DUT are brought into contact with the contacts CNT to electrically connect the DUT, the first contact terminal group 281-1, and the second contact terminal group 282-2 together.

In the present invention, the contact terminals V1-1 to V1-N of the first contact terminal group 281-1 of the first contact instrument 280-1 are connected to the contact terminals W2-1 to W2-N of the second contact terminal group 281-2 of the second contact instrument 280-2 using bridging lines 101B-1 to 101B-N, respectively. First ends of the bridging lines 101B-1 to 101B-N are connected to driver output pins S1-1 to S1-N of IO channels of a first IO channel group IOCH-1 provided in pin electronics PE, using lines 101A-1 to 101A-N, respectively. Second ends of the bridging lines 101B-1 to 101B-N are connected to comparator input pins R1-1 to R1-N of the IO channels of the first IO channel group IOCH-1, using lines 101C-1 to 101C-N, respectively.

The figure shows one channel. However, N, in the present example, eight bridging lines 101B are connected between the first contact instrument 280-1 and the second contact instrument 280-2 in association with the number of contact terminals for the input and output of data. Thus, eight lines 101A and eight lines 101B are also provided in association with the eight channels.

The lines 101A and 101C and the bridging lines 101B are all composed of signal lines having a characteristic impedance of, for example, 50Ω, which matches the output impedance of drivers IODR of the IO channels provided in the pin electronics PE. In the example shown in FIG. 1, the driver output pin S1-1 in the pin electronics PE is connected to a terminal T1-1 provided on the device interface board 260 using a coaxial cable having a characteristic impedance of 50Ω. A micro strip line having a characteristic impedance of 50Ω is used as the bridging wire 101B-1 and is used to connect the terminal T1-1 to the contact terminal V1-1 of the first contact terminal group 281-1 of the first contact instrument 280-1 and to connect a terminal U1-1 to the bridging wire 101B-1 and the contact terminal W2-1 of the second contact terminal group 281-2 of the second contact instrument 280-2. A contact U1-1 is connected to the comparator input pin R1-1 using a coaxial cable having a characteristic impedance of 50Ω. However, the structure of the lines is not limited to the one shown in FIG. 1, As that all the connections may be made using coaxial cables alone or micro strip lines alone. A series terminal resistor $R_{TR}$ is connected is series to an output end of each driver to terminate a total reflected wave returning from the far end of the transmission line. A terminal resistor $R_{TM}$ for impedance matching is connected to an input end of each comparator IOCP.

The terminals V2-1 to V2-N of the first contact terminal group 281-1 of the second contact instrument 280-2 are connected to driver output pins S2-1 to S2-N and comparator input pins R2-1 to R2-N of IO channels of a second IO channel group IOCH-2 in the pin electronics, using separate lines 102A-1 to 102A-N and 102B-1 to 102B-N, respectively. In the example shown in FIG. 1, as the line 102A-1, a coaxial cable having a characteristic impedance of 50Ω is used to connect the driver output pin S2-1 to a terminal T2-1. A micro strip line having a characteristic impedance of 50Ω is used to connect the terminal T2-1 to the contact terminal V2-1 of the first contact terminal group 281-1 of the second contact instrument 280-2. Similarly, as the line 102B-1, a coaxial cable is used to connect the comparator input pin R2-1 to a terminal U2-1. A micro strip line is used to connect the terminal U2-1 to the contact terminal V2-1 of the first contact terminal group 281-1 of the second contact instrument 280-2. However, it is not restricted to use the micro strip line and the coaxial cable in mixed manner, so that all the lines may be composed of coaxial cables alone or micro strip lines alone. In the example shown in FIG. 1, wiring for one channel is only illustrated for the terminals V2-1 to V2-N of the first contact terminal group 281-1 of the second contact instrument 280-2. Similar wirings are provided for the N (for example, eight) contact terminals V2-1 to V2-8N (eight channels) of the first contact terminal group 281-1, which relate to the input and output of data.

In the above configuration, the lengths of the lines 101A and, 101C, and the lengths of the lines 102A, and 102B, including coaxial cables and micro strip lines, have almost the same lengths, respectively and thus the same signal propagation time. However, a data transmission line using the bridging wire 101B has a time delay due to data propagation time through the bridging wire 101B. This requires skew adjustment to be carried out by skew adjusting means provided in the testing apparatus.

Figure 2:
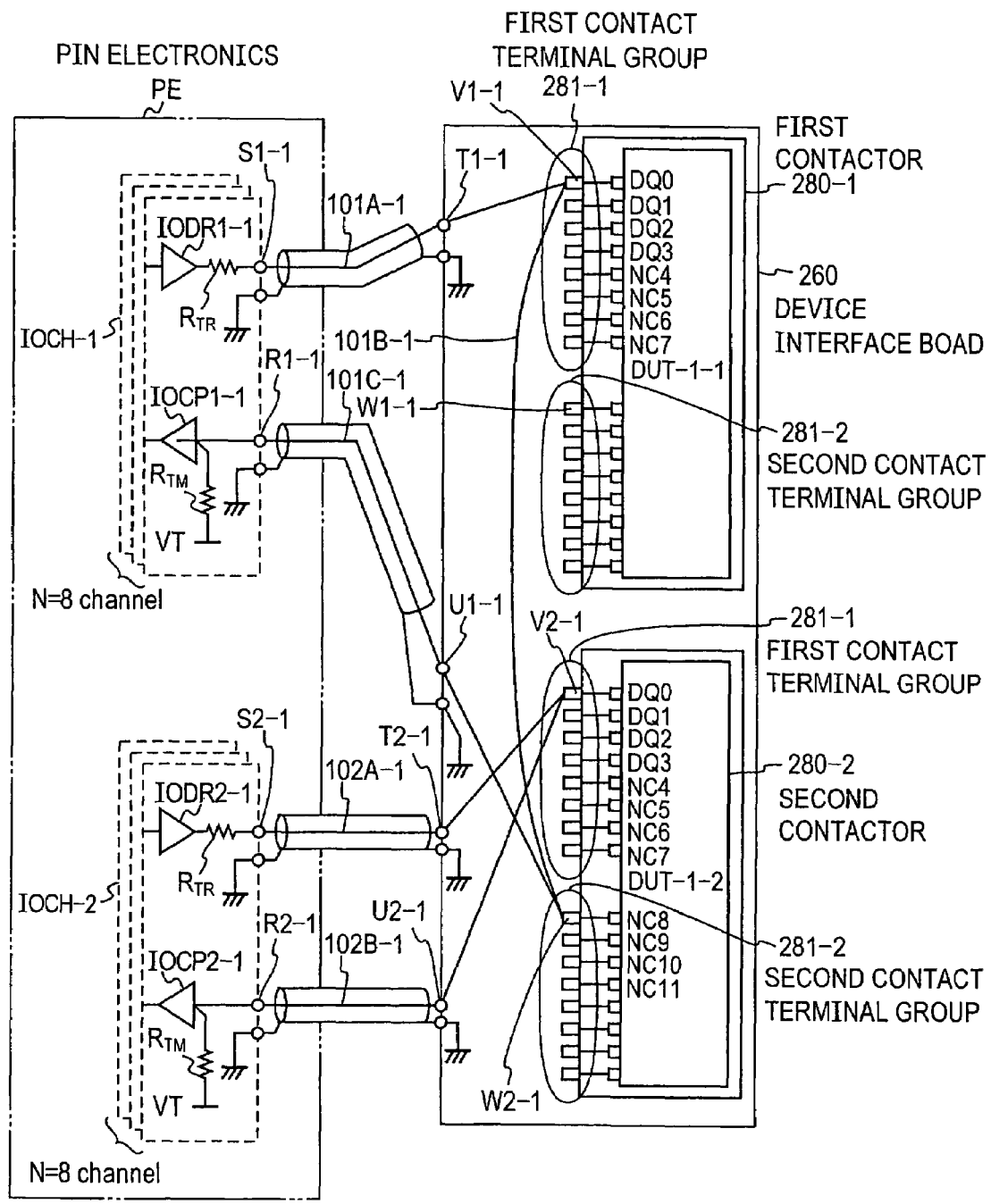
FIG. 2 is a block diagram illustrating the operation and effects of the embodiment shown in FIG. 1.

In the configuration shown in FIG. 1, when first type semiconductor devices DUT-1-1 and DUT-1-1 are installed on the first contact instrument 280-1 and the second contact instrument 280-2, respectively, external terminals DQ0 to DQ3 relating to data of the first type DUT-1 are connected to the pin electronics PE through contact terminals V1-1 to V1-4 of the first contact terminal groups 281-1 of the first contact instrument 280-1 and V2-1 to V2-4 of the second contact instrument 280-2 as shown in FIG. 2. Concurrently, unused external terminals NC8 to NC 11 of the DUT-1-2 installed on the second contact instrument 280-2 are connected to the contact terminals W2-1 to W2-4 of the second contact terminal group 281-2 of the second contact instrument 280-2, respectively. Response signals output by the DUT-1-1 installed on the first contact instrument 280-1 are thus input to comparators IOCP1-1 to IOCP1-4 of the first IO channel group IOCH-1 through the bridging lines 101B-1 to 101B-04 and lines 101C-1 to 101C-4 without any problems. This enables every two first type DUT-1s to be tested at a time. For DUTs of all the types, a power supply terminal and a control terminal of a DUT are assigned at the same positions. Thus, these terminals are not mentioned in the specification.

Figure 3:
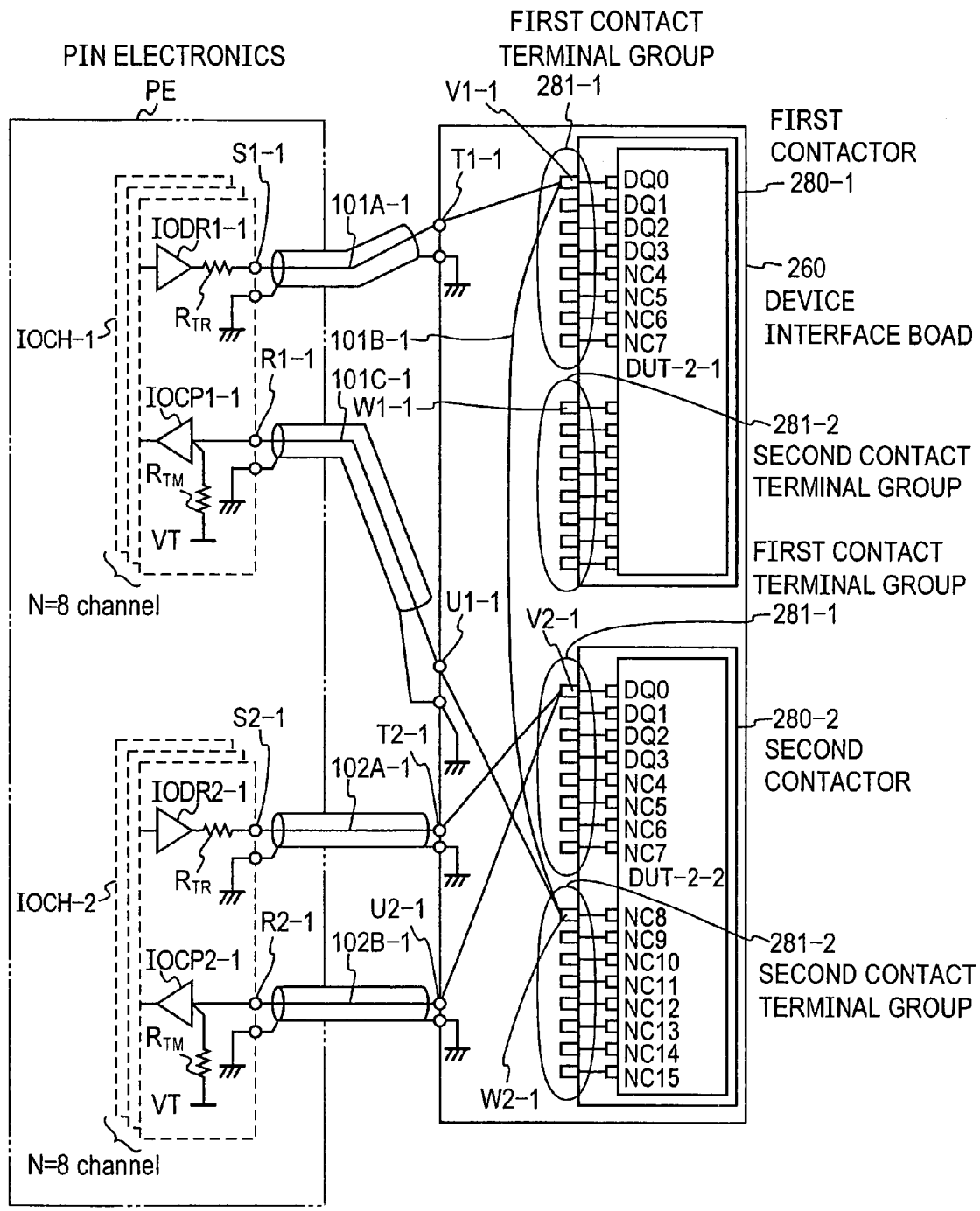
FIG. 3 is a block diagram similar to FIG. 2.

When the second type semiconductor devices DUT-2 are installed on the first contact instrument 280-1 and the second contact instrument 280-2 as shown in FIG. 3, external terminals DQ0 to DQ7 relating to data of the respective second type semiconductor devices DUT-2 are connected to the pin electronics PE through the first contact terminal groups 281-1 of the first contact instrument 280-1 and second contact instrument 280-2, respectively. As in the above case, unused terminals are connected to the second contact terminal group 281-2 of the second contact instrument 280-2 through the bridging wire 101B. This also enables every two second type semiconductor devices to be tested at a time without any troubles.

Figure 4:
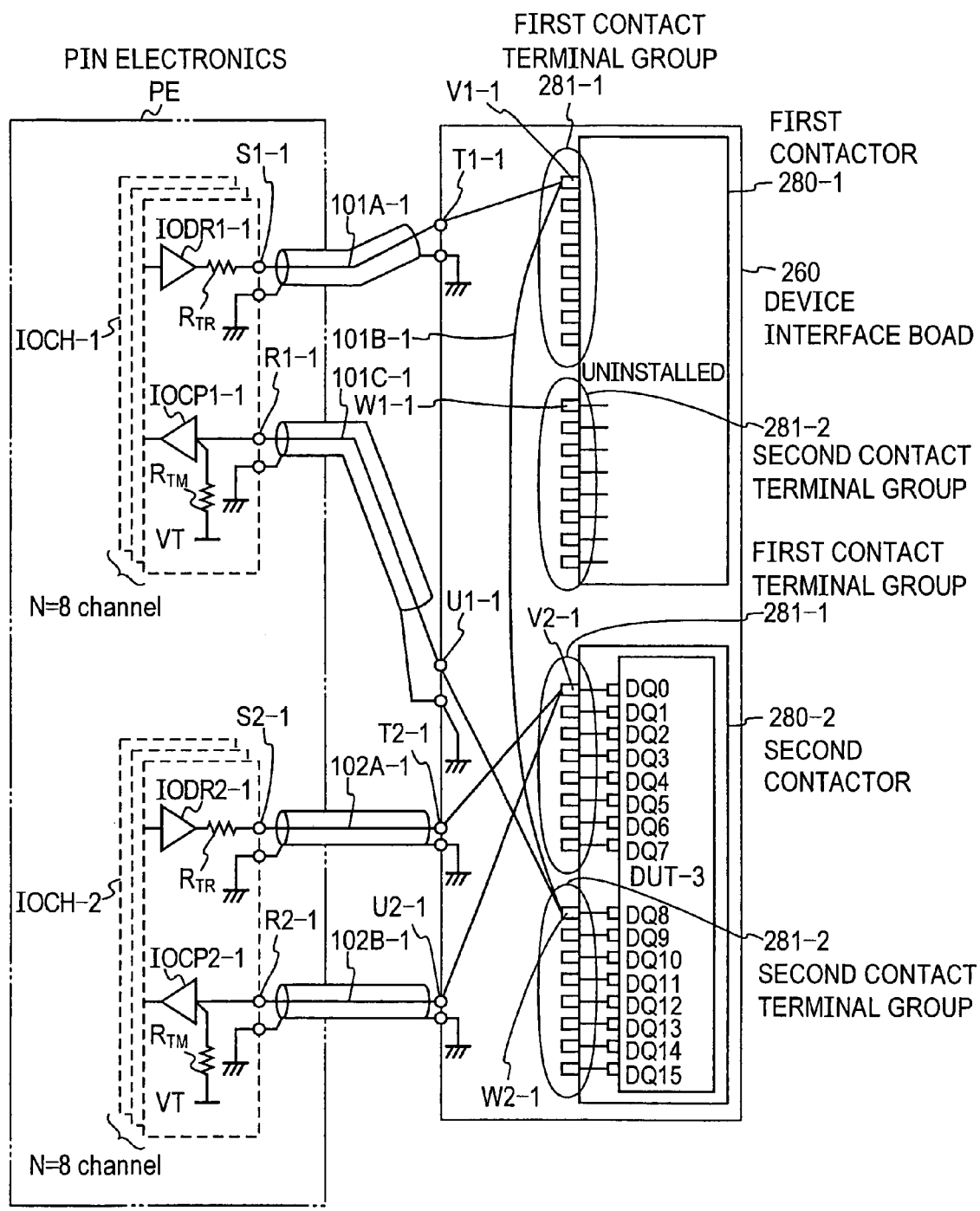
FIG. 4 is a block diagram similar to FIG. 2.

According to the present invention, the third type semiconductor device DUT-3 is installed on the second contact instrument 280-2 whereas the first contact instrument 280-1 is uninstalled as shown in FIG. 4. External terminals DQ0 to DQ15 relating to data of the third type semiconductor device DUT-3 are all connected to the pin electronics PE through the first contact terminal group 281-1 and second contact terminal group 281-2 of the second contact instrument 280-2. This enables one third type semiconductor device DUT-3 to be tested at a time.

As described above, the present invention can test all of the first type semiconductor device DUT-1, the second type semiconductor device DUT-2, and the third type semiconductor device DUT-3 using the contact instrument 280 in common to all the DUT types. The first contact terminal group 281-1 of the first contact instrument 280-1 which is connected to the driver output pin S1 through the line 101A and the second contact terminal group 281-2 of the second contact instrument 280-2 which is connected to the driver output pin S1 through the line 101A and bridging wire 101B have different amounts of propagation delay seen from the driver (S1) and also have different amounts of propagation delay seen from the comparator (R1). The semiconductor device testing apparatus thus needs to previously measure the difference in skew between the first contact terminal group 281-1 and the second contact terminal group 281-2 and to determine test pattern generation conditions and comparator timing determination conditions in consideration to the skew difference. The line length of the bridging line 101B is desirably as short as possible.

Figure 5:
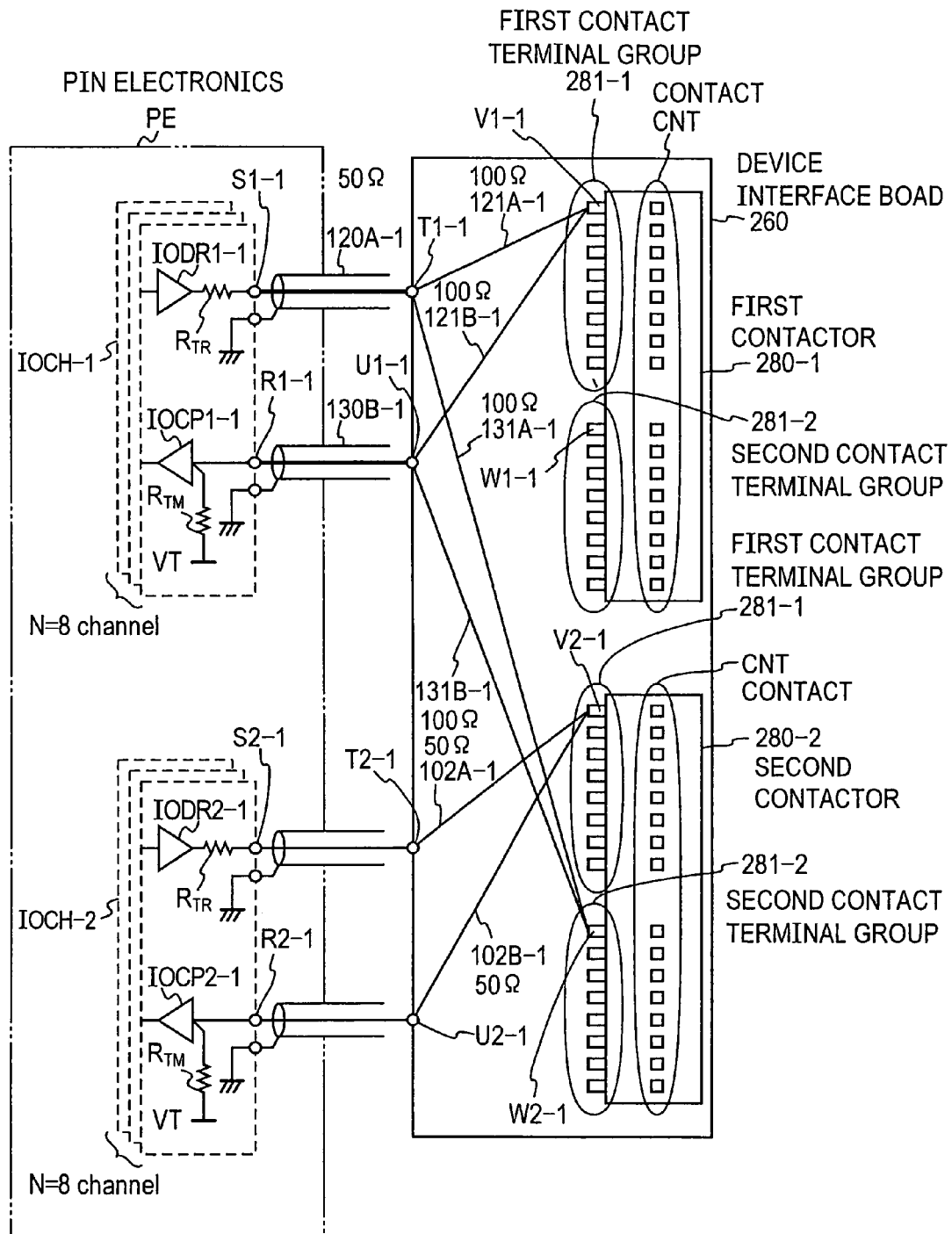
FIG. 5 is a block diagram illustrating an embodiment corresponding to Claim 2 of the present invention.

FIG. 5 shows the configuration of a semiconductor device testing apparatus proposed according to a second invention. In the second invention, the first contact instrument 280-1 and the second contact instrument 280-2 are installed on the device interface board 260 in a same manner as in the case of the first invention. However, the second invention is different from the first invention in the connection structure from the first contact terminal group 281-1 of the first contact instrument 280-1 and the second contact terminal group 281-2 of the second contact instrument 280-2 to the pin electronics PE.

The configuration of the second invention has the following characteristic. First ends of two first branching lines 121A-1 and 131A-1 are connected to mutually corresponding two terminals, which correspond to each other, for example, V1-1 and W2-1 of the first contact terminal group 281-1 of the first contact instrument 280-1 and the second contact terminal group 281-2 of the second contact instrument 280-2, mounted on the device interface board 260, respectively. Second ends of the two first branching lines 121A-1 and 131A-1 are both connected to the terminal TI-1, which is connected through the line 120A-1 to the driver output pin S1-1 of the IO channel of the first IO channel group IOCH-1, provided in the pin electronics PE. First ends of two second branching lines 121B-1 and 131B-1 are connected to mutually corresponding two terminals, for example, V1-1 and W2-1, of the first contact terminal group 281-1 of the first contact instrument 280-1 and the second contact terminal group 281-2 of the second contact instrument 280-2, respectively. Second ends of the two second branching lines 121B-1 and 131B-1 are both connected to the terminal U1-1 provided in the device interface board 260. The terminal U1-1 is connected through the line 130B-1 to a comparator output pin R1-1, provided in the pin electronics PE.

In the second invention, the first contact terminal group 281-1 of the second contact instrument 280-2 is connected to the second IO channel group IOCH-2 in the same manner as that in the first invention.

FIG. 5 illustrates each connection structure for one channel. Similar connections are provided for the first contact terminal group 281-1 of the first contact instrument 280-1 and the first contact terminal group 281-1 and second contact terminal group 282-2 of the second contact instrument 280-2 for all the channels.

In the connection structure shown in FIG. 5, each of the first branching lines 121A and 131A and each of the second branching lines 121B and 131B is designed to have its characteristic impedance matched with double the characteristic impedance of each of the lines 120A and 130A. The pair of the two branching lines 121A and 131A and the pair of the second branching lines 121B and 131B are connected to the terminals T1 and U1 respectively, when seen from the terminals T1 and U1 toward the contact instruments 280-1 and 280-2. The two branching lines are seen to be a parallel connected circuit, so that the respective branching lines 121A and 131A in pair and the respective branching lines 121B and 131B in pair has to have a double characteristic impedance of, for example, 100Ω. Thus, the characteristic impedances seen from the terminals T1 and U1 toward the contact instruments 280-1 and 280-2 are 50Ω.

The connection structure shown in FIG. 5 can also test the first type semiconductor device DUT-1, the second type semiconductor device DUT-2, and the third type semiconductor device DUT-3 as same as described with reference to FIGS. 2, 3, and 4.

Embodiment 1

Figure 6:
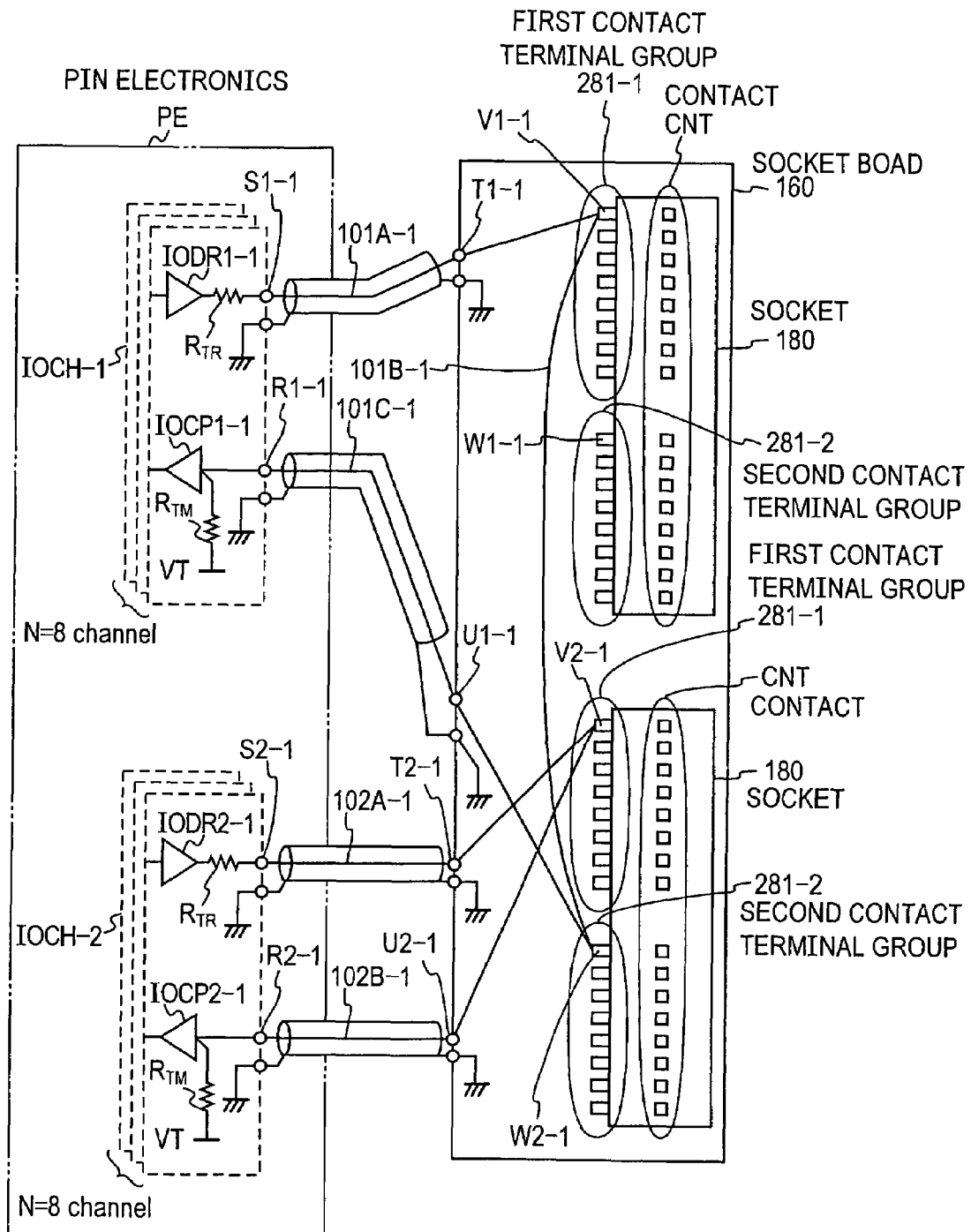
FIG. 6 is a block diagram of a specific example useful for describing the embodiment shown in FIG. 1.
Figure 14:
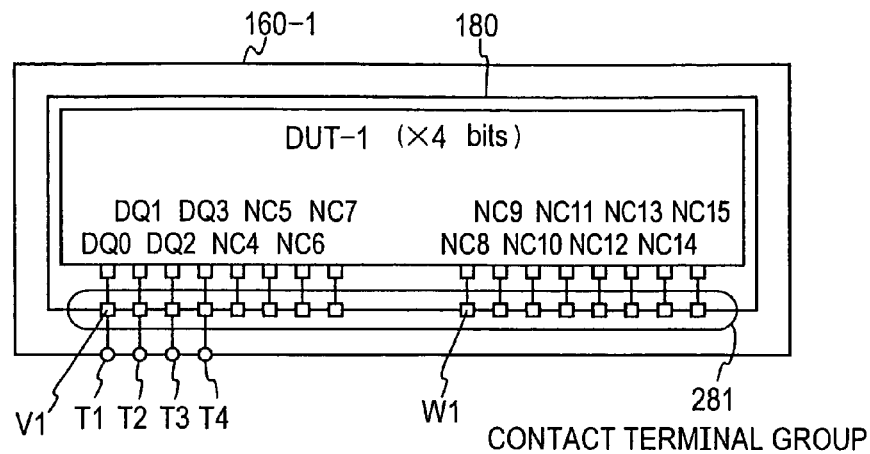
FIGS. 14A, 14B, and 14C are diagrams illustrating examples of socket boards conventionally used to test the three types of semiconductor devices shown in FIGS. 13A, 13B, and 13C.
Figure 14:
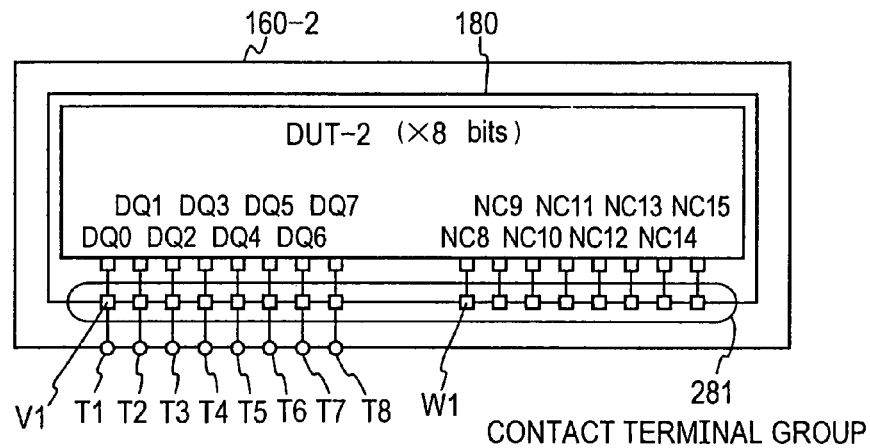
Figure 14:
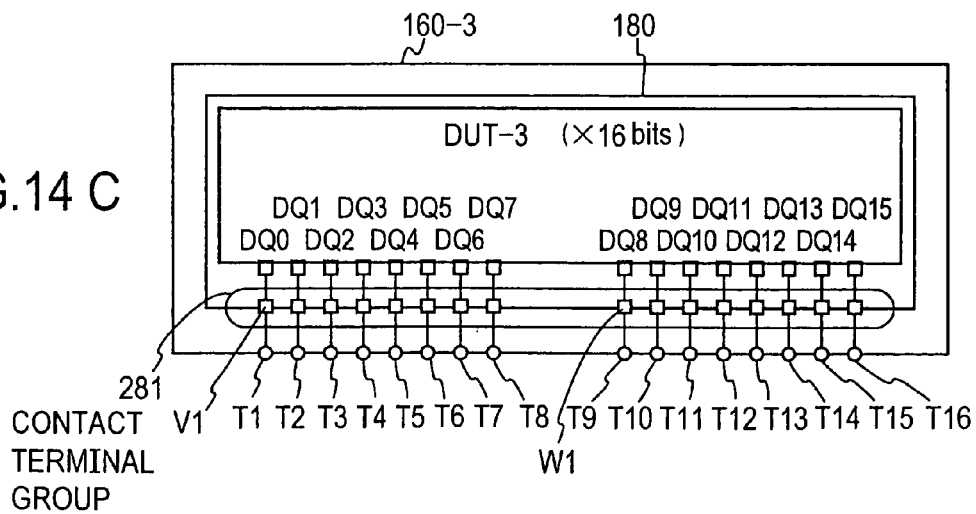

FIG. 6 shows a specific embodiment of the present invention. The embodiment shown in FIG. 6 can test a semiconductor device which has, in the structure of an external terminal of a DUT, pins projected from a package. As described with reference to FIG. 14, a socket is generally used as a contact instrument that connects the pin electronics PE to a semiconductor device in which the pins project from the package. Consequently, sockets 180 replace the parts of the first contact instrument 280-1 and second contact instrument 280-2 shown in FIGS. 1 to 5 are replaced with sockets 180 and the device interface board 260 is correspondingly replaced with a socket board 160. FIG. 6 illustrates the connection structure proposed by the first invention. However, the present embodiment is also applicable to the connection structure proposed by the second invention.

Embodiment 2

Figure 7:
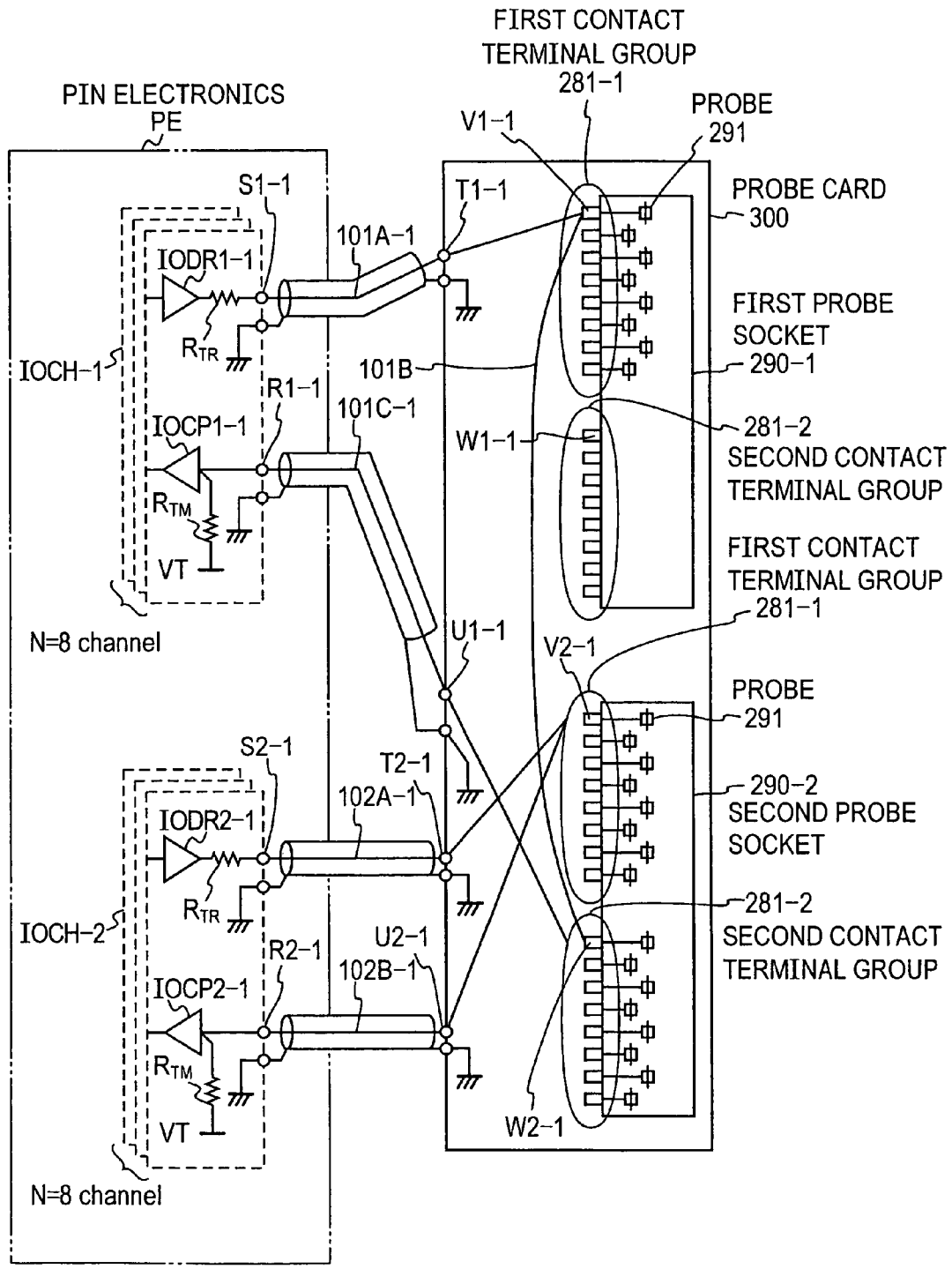
FIG. 7 is a block diagram of another specific example useful for describing the embodiment shown in FIG. 1, similar to FIG. 6.

FIG. 7 shows an embodiment in which the present invention is applied to a semiconductor device present on a semiconductor wafer. For a semiconductor device present on a semiconductor wafer, external terminals called as pads are arranged in an area of the semiconductor wafer in which the device is formed. The tips of needle-like contactors called as probes are pressed against the pads, so that the terminals of the semiconductor device are electrically connected to the pin electronics PE through the probes.

Reference numeral 290-1 shown in FIG. 7 denotes a first probe socket operating as a first contact instrument. Reference numeral 290-2 denotes a second probe socket operating as a second contact instrument. Reference numeral 300 denotes a prober (or probe card) having a large substrate lying opposite the entire surface of the wafer. The first and second probe sockets constitute a part of the probe card and hold probes (or needles) 291 which are detachably connected to the probe card 300. Each probe socket is disposed opposite a semiconductor device corresponding to each IC chip on the wafer. In an example of the probe socket, an opening is generally formed in the substrate constituting the probe card; the opening is larger than the area on the wafer in which the semiconductor device is formed. The first contact terminal group 281-1 and the second contact terminal group 281-2 are arranged around the periphery of the opening. The probes 291 are connected to the first contact terminal group 281-1 and second contact terminal group 282-2 in electric and mechanical communication with them. The probes 291 are supported so as to project into a hollow part of the opening. Some probe cards may have no such the opening.

The first probe socket 290-1 and the second probe socket 290-2 are installed on the probe card 300. The probe card 300 moves along the surface of the wafer in an X-Y direction and a Z direction (vertical direction) to bring the tips of the probes 291 against the corresponding pads of the semiconductor device on the wafer. The first probe socket 290-1 and the second probe socket 290-2 lie opposite to and contact with the respective semiconductor devices on the wafer.

The connections described below allow the configuration of the first invention to be applied to the first probe socket 290-1 and the second probe socket 290-2. Same as in the case of FIG. 1, the terminals of the first contact terminal group 281-1 of the first probe socket 290-1 are connected to the corresponding terminals of the second contact terminal group 281-2 of the second probe socket 290-2, using the bridging lines 110B. One end of each bridging line 101B is connected to the driver output pin S1, provided in the pin electronics PE, via the terminal T1 through the line 101A. The other end of the bridging line 101B is connected to the comparator input pin R1, provided in the pin electronics PE, via the terminal U1 through the line 101C. The above configuration is provided for all the contact terminals of the first contact terminal group 281-1 of the first probe socket 290-1 and the second contact terminal group 281-2 of the second probe socket 290-2. Further, for the first contact group 281-1 of the second probe socket 290-2, all the terminals of the first contact terminal group 281-1 of the second probe socket 290-2 may be configured to connect to the driver output pin S2 and comparator input pin R2 through the different lines 102A and 102B.

This configuration enables every two first or second type semiconductor devices present on the wafer to be tested at a time.

However, in this case, if the third type semiconductor devices are subjected to test, the first probe socket 290-1 should not install with the probes 291. Consequently, the probes 291 desirably have a detachable structure. Further, by forming a third type semiconductor device on the wafer only at the position of the second probe socket 290-2 and not at the position of the first probe socket 290-1, it is possible to test semiconductor devices one by one using the configuration shown in FIG. 7. For the first, second, and third type semiconductor devices present on the wafer, the pads need to be formed in the same positional relationship.

Embodiment 3

Figure 8:
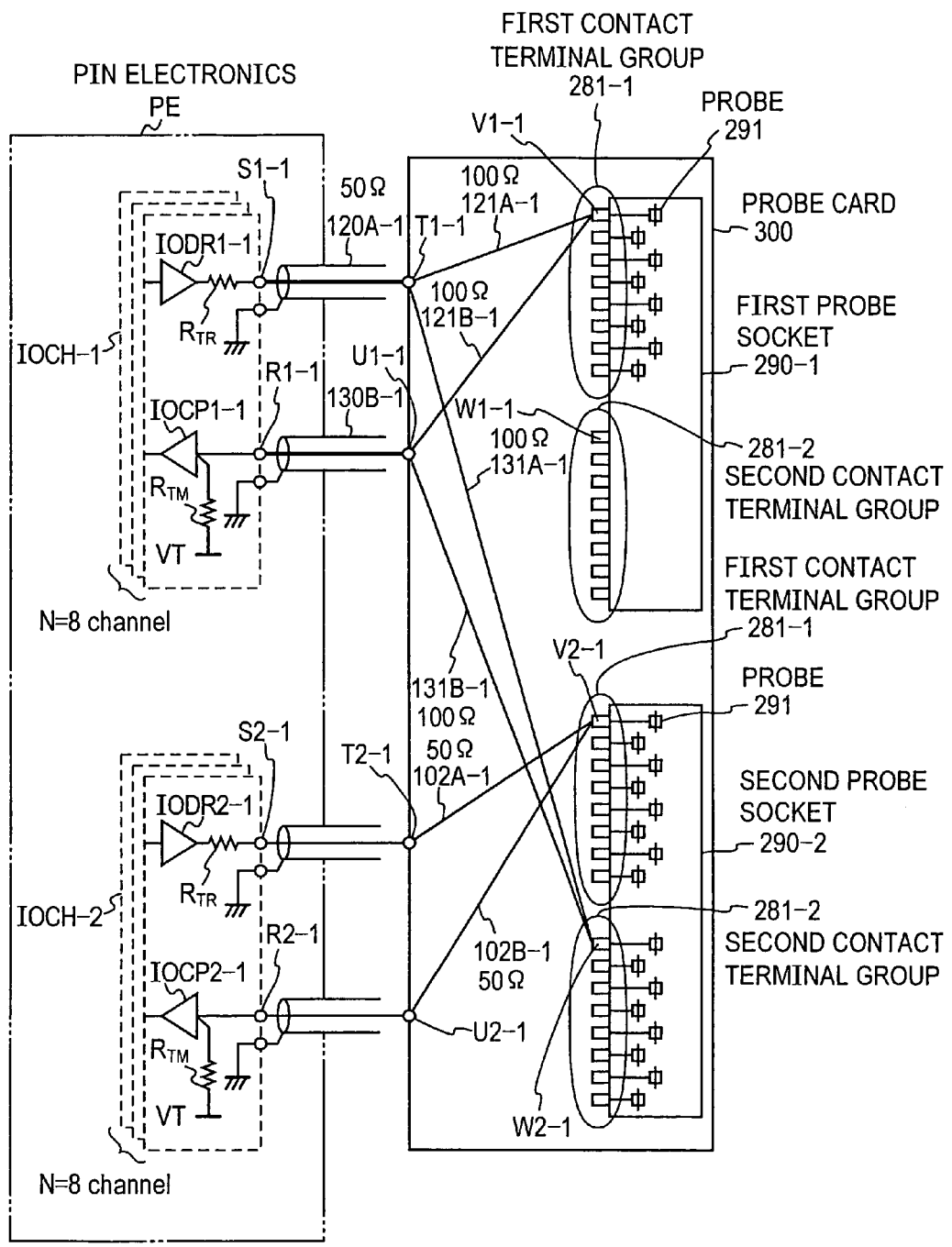
FIG. 8 is a block diagram a further specific example useful for describing the embodiment shown in FIG. 5.

FIG. 8 shows an embodiment in which the connection configuration in accordance with the second invention is applied to probe cards. In the present embodiment, the first probe socket 290-1 and the second probe sockets 290-2 enables every two first or second semiconductor devices on the semiconductor wafer to be tested at a time. The reason is the same as that explained with reference to FIGS. 2 and 3 and thus will not be described in further detail. In the present embodiment, however, by avoiding installation of the probes 291 on the first probe socket 290-1, it is possible to test the third type semiconductor device using the second probe socket 290-2.

Embodiment 4

Figure 9:
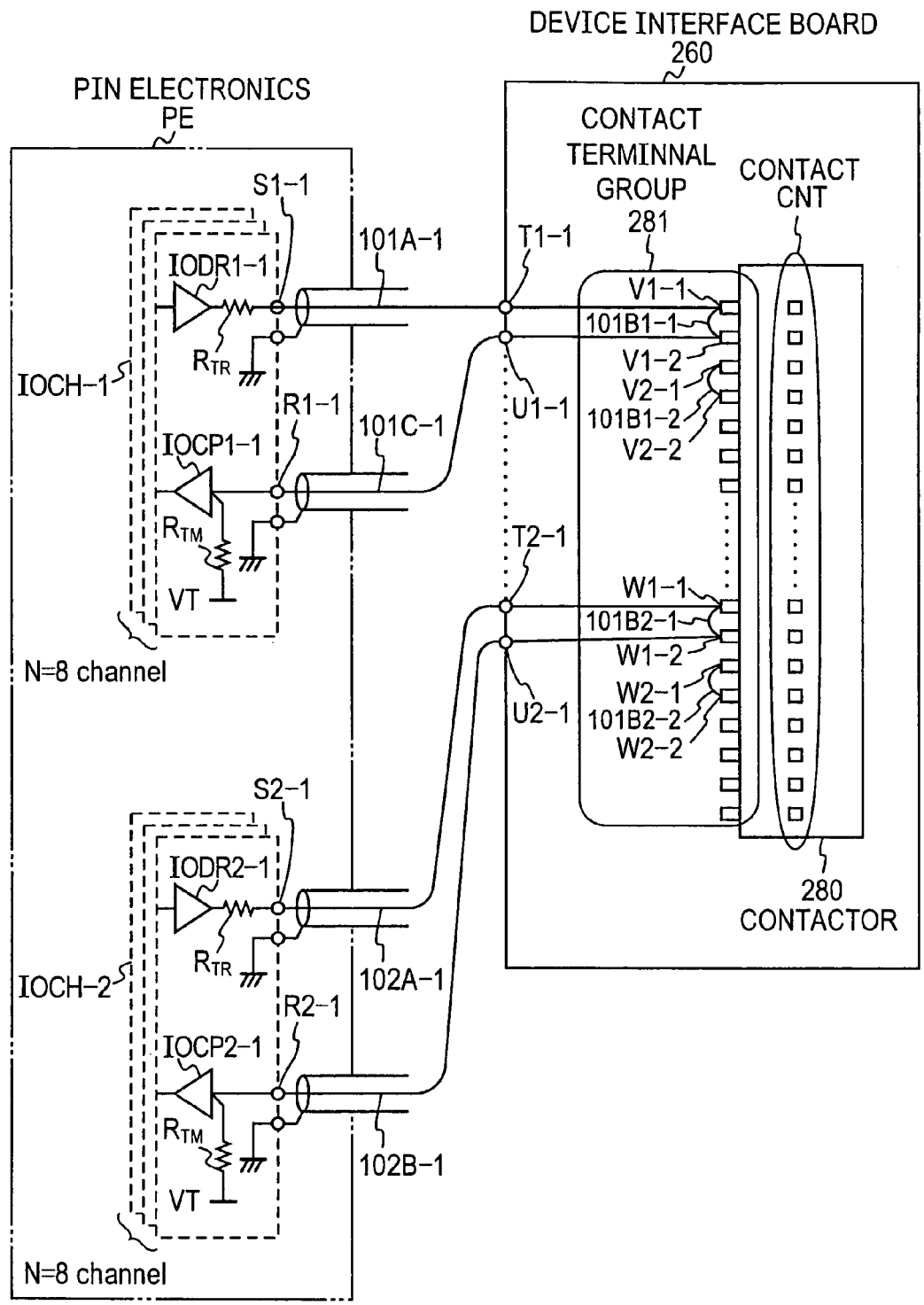
FIG. 9 is a block diagram illustrating an embodiment corresponding to Claim 3 of the present invention.

FIG. 9 shows a connection configuration proposed by a third invention. The proposed connection configuration is applied to test a semiconductor device having a paired data input/output terminals of which are differentially switched between an operation mode and a non-operation mode using different timings. Semiconductor devices having such a characteristic are present in graphic devices. These semiconductor devices have been previously tested using a connection structure in which the first contact terminal group 281-1 of the second contact instrument 280-2, shown in FIGS. 1 to 5, is connected to the pin electronics PE for each terminal or in which the first contact terminal group 281-1 of the first contact instrument 280-1 and the second contact terminal group 281-2 of the second contact instrument 280-2, shown in FIG. 5, are connected to the pin electronics PE for each terminal. If the connection structure is adopted in which the first contact terminal group of the second contact instrument 280-2, shown in FIGS. 1 to 5, is connected to the pin electronics PE, it is necessary to provide drivers and comparators the number of which corresponds to the number of data input/output pins of DUT.

In contrast, if the branching connection structure, shown in FIG. 5, is adopted, the number of the driver and comparator set is about half the number of data input/output pins of DUT. However, if the branching structure connections, shown in FIG. 5, are adopted, the lines 121A, 121B, 131A, and 131B need to have a characteristic impedance about double that of the other lines 120A and 130A, as also described with reference to FIG. 5. If the lines 120A and 130B have a characteristic impedance of 50Ω, the lines 121A, 121B, 131A, and 131B must have a characteristic impedance of about 100Ω. When a circuit with a characteristic impedance of 50Ω is converted into a parallel connection circuit with a characteristic impedance of 100Ω at a junction point, signal reflection may occur to inconveniently degrade the waveform quality.

To avoid this inconvenience, the third invention claims the following point. Two terminals operating during different periods to each other in accordance with switching control signals are connected together using a bridging line. One of the two terminals is connected to the driver output pin provided in the pin electronics, while the other terminal is connected to the comparator input pin provided in the pin electronics. The two terminals can thus be tested using a common line.

FIG. 9 shows the embodiment. Reference numeral 280 shown in FIG. 9 denotes a contact instrument. Contacts CNT are arranged on the contact instrument. Pin-shaped external terminals of a DUT (not shown in the drawings) are contacted with the contacts CNT to electrically connect to the contact terminals of the contact terminal group 281.

Contact terminals V1-1 and V1-2, V2-1 and V2-2, . . . , VN-1 and VN-2 as well as W1-1 and W1-2, W2-1 and W2-2, . . . , WN-1 and WN-2 of the contact terminal group 281 show pairs of contact terminals, each pair contacting to respective pins of pairs of the operating pins. The pairs of the contact terminals are connected together using bridging lines 101B1-1 to 101B1-N and 101B2-1 to 101B2-N, respectively. One end of each bridging line 101B, for example, 101B1-1, is connected to the driver output pin S1-1 of the first IO channel IOCH-1, provided in the pin electronics PE, via the terminal T1-1 and through line 101A-1. The other end of the bridging line 101B1-1 is connected to the comparator input pin R1-1, provided in the pin electronics PE, via the terminal U1-1 and through line 101C-1. FIG. 9 shows connections for two channels (the second IO channel IOCH-2 has similar connections); all the input/output pins of the DUT operating in pairs are connected in this manner.

This configuration deals with a specific DUT which does not have a simultaneous output condition in a manner described below. The configuration can test one of the pins in pair connected together of the DUT by controlling operative, allowing the driver to apply a test pattern signal through the line 101A, and loading a response signal into the comparator through the line 101C.

When the one of the pins becomes inoperative, the other pin is switched to the operative state. The other pin is then tested. While a pair of pins (for example, V1-1 and V1-2) are tested by the IOCH-1, another pair of pin (for example, W1-1 and W1-2) are concurrently tested by the IOCH-2. This enables a DUT with 32 IO pins to be tested using 16 IO channels. The paired pins are connected together using the bridging line and thus have different amounts of propagation delay seen from the driver and different amounts of propagation delay seen from the comparator. Thus, the semiconductor device testing apparatus needs to previously measure the difference in skew between the pins and determine the test pattern generation conditions and comparator timing determination conditions in consideration to the skew difference.

In the connection structure proposed by the third invention, all of the lines 101A and 101C and the bridging line 101B can have a characteristic impedance of 50Ω. As a result, due to no existence in the characteristic impedance through the lines, the degradation of the waveform quality is prevented.

Figure 10:
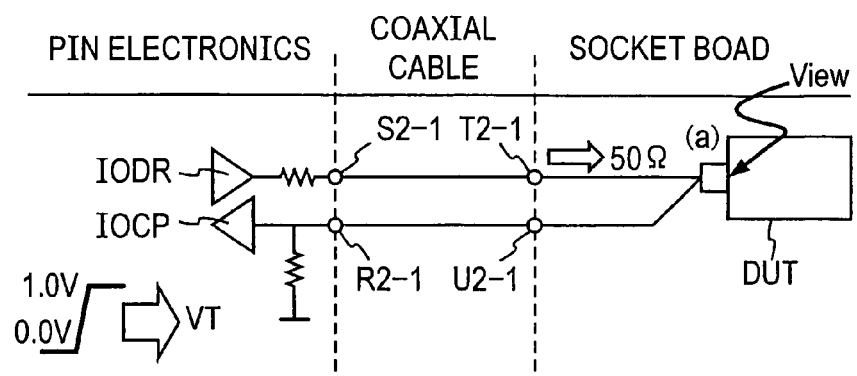
FIG. 10A is a diagram showing a connection configuration of drive signal transmission lines in a semiconductor device testing apparatus in accordance with the first or second invention.
FIG. 10B is a diagram showing a connection configuration of drive signal transmission lines in a semiconductor device testing apparatus in accordance with the third invention.
FIG. 10C is a diagram of waveforms observed in the configurations in FIGS. 10A and 10B.
Figure 10:
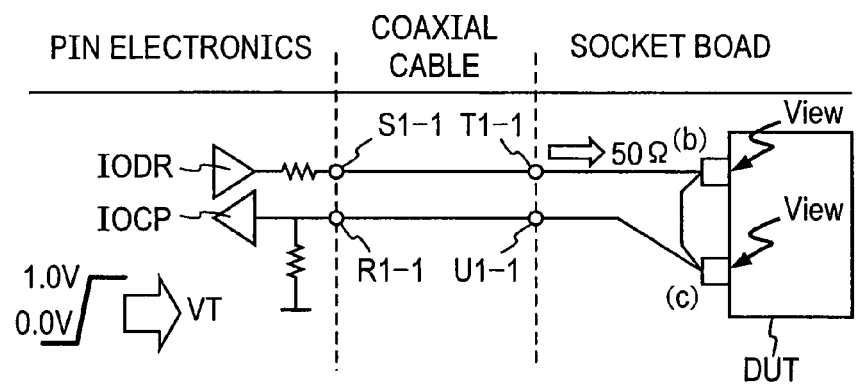
Figure 10:
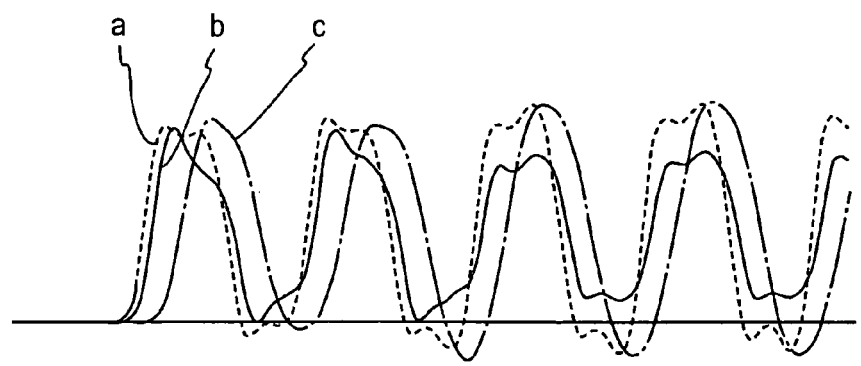
Figure 11:
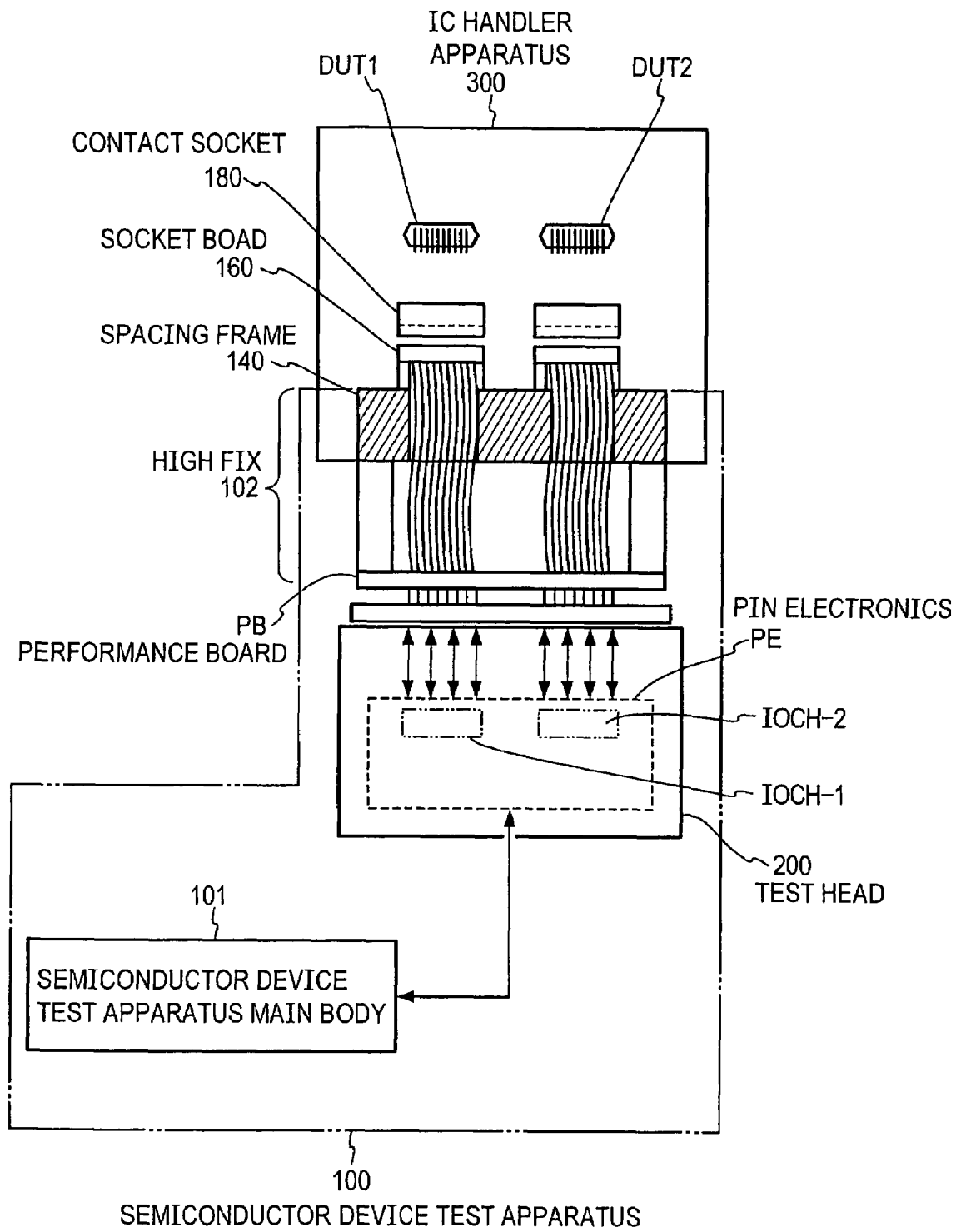
FIG. 11 is a diagram illustrating a connection configuration of the semiconductor device testing apparatus and an IC handler apparatus.
Figure 12:
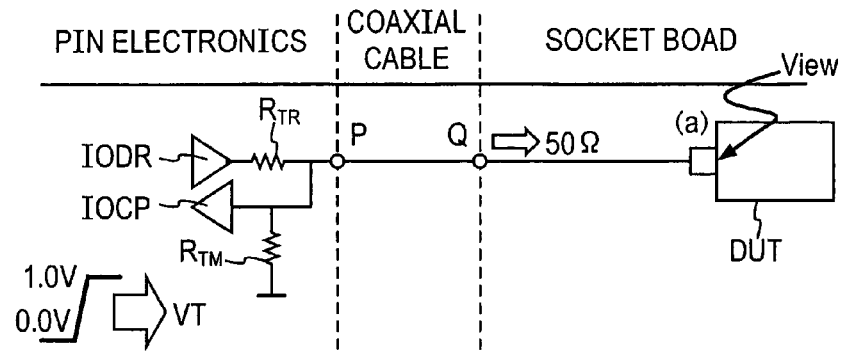
FIG. 12A is a diagram of a connection configuration of drive signal transmission lines in a prior art semiconductor device testing apparatus.
FIG. 12B is a diagram of a connection configuration of drive signal transmission lines in a semiconductor device testing apparatus in a trial example which is not known by public.
FIG. 12C is a diagram of waveforms observed in the configurations of FIGS. 12A and 12B.
Figure 12:
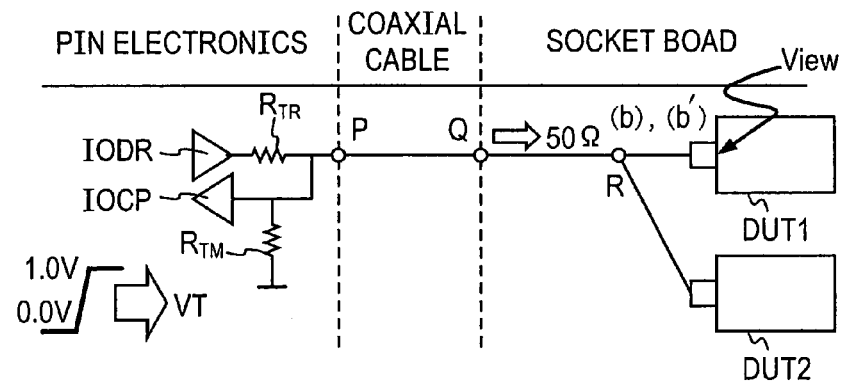
Figure 12:
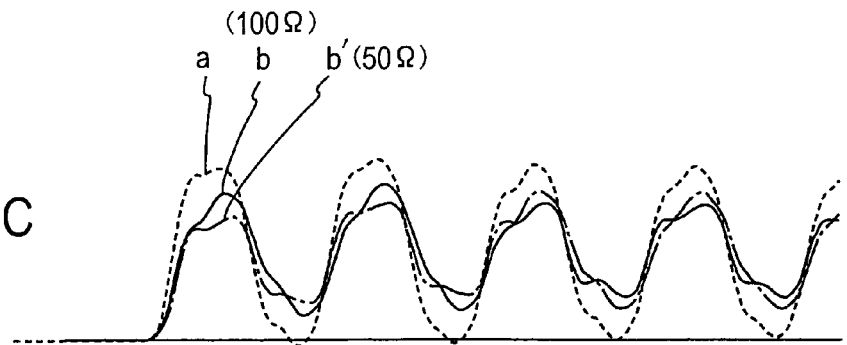
Figure 13:
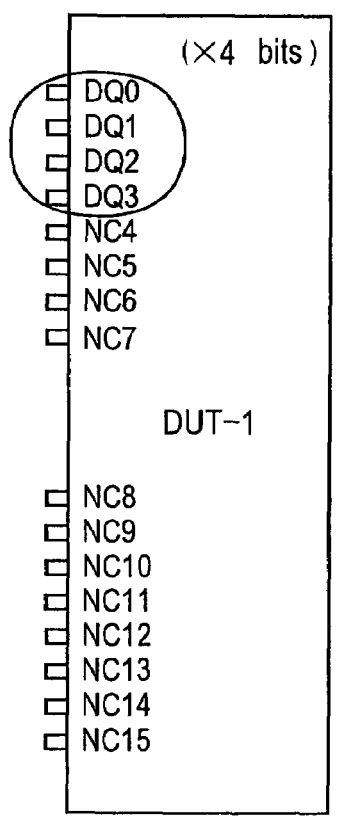
FIGS. 13A, 13B, and 13C are diagrams illustrating an example of three types of semiconductor devices having different numbers of pins used.
Figure 13:
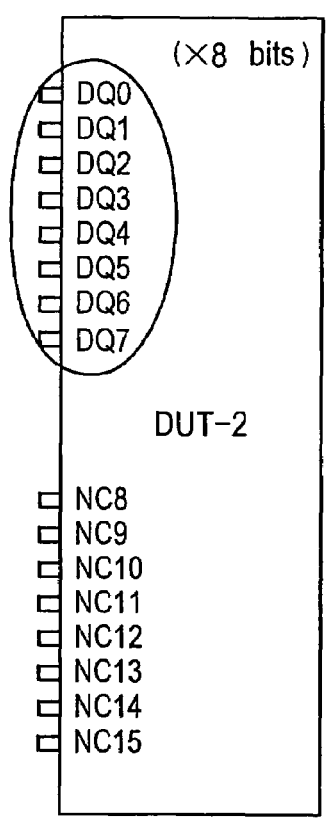
Figure 13:
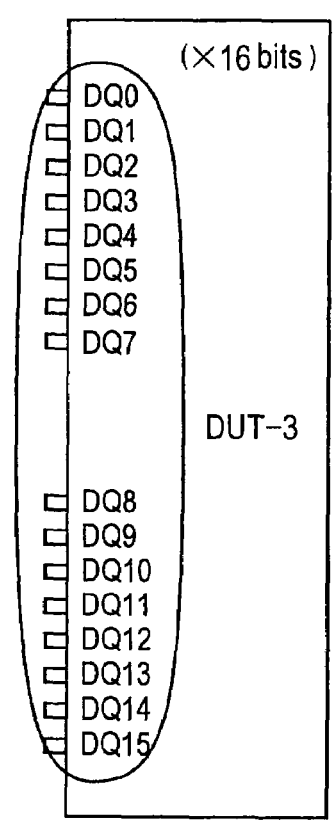

FIG. 10 shows an example of waveform measurements.

FIG. 10A shows the connection structure of a first contact terminal in the second contact instrument 280-2 in the configuration in FIGS. 1 to 8 in accordance with the first or second invention. FIG. 10B shows the connection structure proposed by the third invention. FIG. 10C shows examples of observed waveforms to compare the above connection structures with each other. FIG. 10C shows waveforms a, b, and c observed at observation points (a), (b), and (c) shown in FIGS. 10A and 10B, while applying a rectangular wave from the driver IODR. The waveforms clearly indicate that the connection structure proposed by the third invention suppresses the degradation of the waveform because of the continuous matched impedance.

INDUSTRIAL APPLICABILITY

The semiconductor device testing apparatus and device interface board in accordance with the present invention are utilized in the semiconductor device manufacture and development fields and the like.

What is claimed is:

1. A semiconductor device testing apparatus for testing a first type semiconductor device having a first external terminal group and a second external terminal group and operatingly using a part of the first external terminal group, a second type semiconductor device having the same external terminal array as that of the first type semiconductor device and operatingly using all of the first external terminal group, and a third type semiconductor device having the same external terminal array as those of the first and second type semiconductor devices and operatingly using all of the first and second external terminal groups, characterized in that:

a device interface board is provided with a first contact instrument and a second contact instrument each having a first contact terminal group corresponding to the first external terminal group and a second contact terminal group corresponding to the second external terminal group so that any of the first, second, and third type semiconductor devices can be connected to the first contact instrument and the second contact instrument;

bridging lines are connected between the contact terminals of the first contact terminal group of the first contact instrument and corresponding contact terminals of the second contact terminal group of the second contact instrument;

one end of each said bridging line is connected to each said driver output pin of a corresponding IO channel of the first IO channel group provided in pin electronics in association with the first contact instrument;

the other end of each said bridging line is connected to each said comparator input pin of the corresponding IO channel of the first IO channel group; and each said contact terminal of the first contact terminal group of the second contact instrument is connected, using different connection lines, to each said driver output pin and each said comparator input pin of a corresponding IO channel of the second IO channel group provided in the pin electronics in association with the second contact instrument.

2. The semiconductor device testing apparatuses according to claim 1, wherein the external terminals of the semiconductor device are composed of pins led out of a package, the first and second contact instruments comprise a first socket and a second socket, respectively, and the device interface board comprises a socket board, and the first and second sockets are mounted on the socket board, and wherein the first or the second type semiconductor device is attached to each of the first and second sockets, or the third type semiconductor device is attached to the second socket in order to test the device.

3. The semiconductor device testing apparatuses according to claim 1, wherein the external terminals of the semiconductor device are composed of pads formed on a semiconductor wafer, the first and second contact instruments comprise a first probe socket and a second probe socket, respectively, the device interface board is composed of a prober, and the first and second probe sockets are mounted on the prober, and wherein the first or second type semiconductor device is contacted with probes attached to each of the first and second probe sockets in order to test the device.

4. The device interface board used in any of the semiconductor device testing apparatuses according to claim 2, wherein each of the bridging line, the connection line connecting one end of the bridging line to the driver output pin of the IO channel provided in the pin electronics, and different connection line connecting the other end of the bridging line to the comparator input pin of the IO channel provided in the pin electronics, has a characteristic impedance that matches an output impedance of a driver provided in the pin electronics, respectively, and wherein these lines are mounted on the board.

5. The device interface board used in any of the semiconductor device testing apparatuses according to claim 3, wherein each of the bridging line, the connection line connecting one end of the bridging line to the driver output pin of the IO channel provided in the pin electronics, and different connection line connecting the other end of the bridging line to the comparator input pin of the IO channel provided in the pin electronics, has a characteristic impedance that matches an output impedance of a driver provided in the pin electronics, respectively, and wherein these lines are mounted on the board.

* * * * *